United States Patent
Slavin

(10) Patent No.: US 8,112,578 B2
(45) Date of Patent: Feb. 7, 2012

(54) LOW POWER, HASH-CONTENT ADDRESSABLE MEMORY ARCHITECTURE

(75) Inventor: Keith R. Slavin, Beaverton, OR (US)

(73) Assignee: Micron Technology, Inc., Boise, ID (US)

( * ) Notice: Subject to any disclaimer, the term of this patent is extended or adjusted under 35 U.S.C. 154(b) by 2249 days.

(21) Appl. No.: 10/002,461

(22) Filed: Nov. 1, 2001

(65) Prior Publication Data

US 2003/0093616 A1 May 15, 2003

(51) Int. Cl.
G06F 13/00 (2006.01)
(52) U.S. Cl. .................... 711/108; 711/216; 711/221
(58) Field of Classification Search .................. 711/108, 711/216, 221
See application file for complete search history.

(56) References Cited

U.S. PATENT DOCUMENTS

| | | | |
|---|---|---|---|
| 3,701,980 A | 10/1972 | Mundy | |
| 5,359,720 A | 10/1994 | Tamura et al. | |
| 5,386,413 A * | 1/1995 | McAuley et al. | 370/392 |
| 5,414,704 A | 5/1995 | Spinney | |
| 5,617,348 A | 4/1997 | Maguire | |
| 6,044,005 A | 3/2000 | Gibson et al. | |
| 6,081,441 A | 6/2000 | Ikeda | |
| 6,101,115 A | 8/2000 | Ross | |
| 6,166,939 A | 12/2000 | Nataraj et al. | |
| 6,181,592 B1 | 1/2001 | Aoki | |
| 6,191,969 B1 | 2/2001 | Pereira | |
| 6,191,970 B1 | 2/2001 | Pereira | |
| 6,226,710 B1 | 5/2001 | Melchior | |
| 6,230,231 B1 * | 5/2001 | DeLong et al. | 711/3 |
| 6,236,658 B1 | 5/2001 | Essbaum et al. | |
| 6,237,061 B1 * | 5/2001 | Srinivasan et al. | 711/108 |
| 6,240,001 B1 | 5/2001 | Ross | |
| 6,243,280 B1 | 6/2001 | Wong et al. | |
| 6,339,539 B1 * | 1/2002 | Gibson et al. | 365/49 |
| 6,438,674 B1 * | 8/2002 | Perloff | 711/216 |
| 6,502,163 B1 * | 12/2002 | Ramankutty | 711/108 |
| 6,538,911 B1 * | 3/2003 | Allan et al. | 365/49 |
| 6,574,702 B2 * | 6/2003 | Khanna et al. | 711/108 |
| 6,665,202 B2 * | 12/2003 | Lindahl et al. | 365/49 |
| 6,665,297 B1 * | 12/2003 | Hariguchi et al. | 370/392 |
| 6,728,124 B1 * | 4/2004 | Ichiriu et al. | 365/49 |

(Continued)

OTHER PUBLICATIONS

'A Reconfigurable Content Addressable Memory' by Guccione et al., published by Xilinx Inc., 10 pages.*

(Continued)

*Primary Examiner* — Reba I. Elmore
(74) *Attorney, Agent, or Firm* — Thorp Reed & Armstrong, LLP

(57) ABSTRACT

A comparand word is input to a plurality of hash circuits, with each hash circuit responding to a different portion of the comparand word. The hash circuits output a hash signal which enables or precharges portions of a content addressable memory CAM. The comparand word is also input to the CAM. The CAM compares the comparand word in the precharged portions of the CAM and outputs information responsive to the comparison. When Internet addresses are processed, the output information is either port information or an index for locating port information.

30 Claims, 5 Drawing Sheets

U.S. PATENT DOCUMENTS

| | | | |
|---|---|---|---|
| 6,735,670 B1 * | 5/2004 | Bronstein et al. | 711/108 |
| 6,738,862 B1 * | 5/2004 | Ross et al. | 711/108 |
| 6,757,779 B1 * | 6/2004 | Nataraj et al. | 711/108 |
| 6,792,502 B1 * | 9/2004 | Pandya et al. | 711/108 |
| 7,002,965 B1 * | 2/2006 | Cheriton | 370/395.32 |
| 2002/0143787 A1 * | 10/2002 | Knee et al. | 707/102 |
| 2003/0188089 A1 * | 10/2003 | Perloff | 711/108 |

OTHER PUBLICATIONS

Tadato Yamagata, et al.; "A 288-kb Fully Parallel Content Addressable Memory Using a Stacked-Capacitor Cell Structure"; IEEE Journal of Solid-State Circuits; Dec. 1992: pp. 1927-1933: vol. 27. No. 12.

* cited by examiner

LOW POWER, HASH-CONTENT ADDRESSABLE MEMORY ARCHITECTURE

BACKGROUND OF THE INVENTION

1. Field of the Invention

The present invention is directed to memory devices and, more particularly, to content addressable memories (CAMs).

2. Description of the Background

A CAM includes an array of memory cells arranged in a matrix of rows and columns. Each memory cell stores a single bit of digital information, i.e., either logic zero or logic one. The bits stored within a row of memory cells constitute a CAM word. During compare operations, a comparand word is received from an input bus and then compared with all the CAM words. For highest performance, conventional CAM architectures simultaneously compare all of their pattern entries with the input bus. For each CAM word that matches the comparand word, a corresponding match line signal is asserted to indicate a match condition. When there is a match condition, the index or address of the matching CAM word is read from the CAM. Associative information stored in, for instance, an associated RAM, may also be provided. Because CAMs provide a mechanism that enables matches to be quickly located, CAMs have come to be used in devices, such as routers.

Routers are used in interconnected computer networks, such as the Internet, to couple networks together. Such a computer network router is typically connected to two or more distinct networks. For a message sent from one network to another destination network, the router receives the message, in the form of data packets, from one of the networks to which the router is connected and searches a database of routing information to determine to which of the connected networks the data packet should next be sent so that the data packet can reach the destination network. The database of routing information can be quite large in networks composed of many different interconnected networks, such as the Internet. Within each router, routing information received from neighboring routers is used to update its own routing table. That table is then used to control how packets are routed from one neighboring router to another on the network. Because CAMs use dedicated parallel hardware for comparisons, they are ideal for use in routers and other high performance systems.

An Internet protocol (IP) address size is a fixed width for a particular protocol, so a prefix length must be less than or equal to the IP address size. The CAM effectively compares an incoming IP address with all of its contents to find a match. The number of prefix bits can be specified independently for each routing table entry, so lower address bits are ignored within each CAM entry during comparisons. The simplest way to implement that behavior in a CAM is to use a ternary CAM (TCAM) that can be programmed to match entries with a 0, 1 or X (don't care) at each bit position within each CAM entry.

In cases where a TCAM input results in matches found with multiple entries having different prefix lengths, the routing rules require that the match with the longest prefix length is chosen. In the case where only one match is possible for any input pattern, the order in which entries are placed in the TCAM does not matter, as they are all normally compared with the input. When multiple TCAM matches are possible, the simplest way to prioritize matches is on the address at which entries are written into the TCAM. For example, if the TCAM prioritizes entries at its higher programming addresses, then the TCAM loading algorithm can sort data by prefix length to ensure that longer prefix entries are written to the TCAM at a higher address than shorter prefix entries. In IP routing tables, it is not permitted to have identical matching prefix values of the same prefix length.

A known problem with CAMs is that entry miss-matches are far more common than matches, so match lines are usually charged and discharged on every access. As described below in conjunction with FIG. 6, that makes CAM power consumption relatively high compared with other storage devices.

FIG. 6 shows a typical CAM row 10 as having n CAM cells 12(1)-12(n) each coupled to an associated match line ML. A pull-up transistor 14, coupled between a supply voltage VDD and match line ML, has a gate tied to ground potential, and therefore remains in a conductive state. Prior to each compare operation between an n-bit comparand word and an n-bit CAM word stored in CAM cells 12(1)-12(n), match line ML is pre-charged to supply voltage VDD via pull-up transistor 14. The n-bits of the comparand word are compared with corresponding bits of the CAM word in respective CAM cells 12(1)-12(n). If all bits of the comparand word match corresponding bits of the CAM word, the match line ML remains charged to indicate a match condition. Conversely, if one of the comparand bits does not match the corresponding CAM bit, the CAM cell 12 storing that CAM bit discharges match line ML toward ground potential to indicate a mismatch condition.

The match lines in a CAM array are typically pre-charged to the supply voltage VDD for each and every compare operation. Thus, for each mismatch condition, an associated match line ML is first charged toward VDD and then discharged toward ground potential. Current flow associated with this charging and discharging results in undesirable power consumption. Further, as the number of CAM cells in each row of a CAM array increases, capacitive loading on the match lines increases accordingly. As loading on the match lines increases, the current required to charge the match lines toward the supply voltage increases. Accordingly, as CAM words are widened, for example, to accommodate longer Internet addresses, power consumption resulting from charging the match lines during compare operations may significantly increase. Furthermore, because mis-matches are far more common than matches, as internet Addresses are lengthened and CAM words widened, power consumption increases substantially. Therefore, the need exits for a circuit architecture that reduces the power consumed by the CAM.

SUMMARY OF THE PRESENT INVENTION

The present invention includes an apparatus and a method of reducing the match line pre-charging activity for a CAM access while allowing operation at the highest possible CAM speeds. The method involves sending a comparand word to a CAM and also sending the comparand word to a set of hash circuits, one for each legal prefix length, for parallel comparisons. For each prefix length value, that number of most significant bits is enabled from the comparand word to the corresponding hashing circuit. Each hash circuit output value is therefore dependent on a different number of bits from the comparand word. The number of bits on each hash circuit output can be optimized for the expected number of entries corresponding to the prefix length in typical usage. If the prefix length profile is unknown, each hash circuit output may have the same number of bits. Each hash circuit output then goes to the address of a corresponding memory look-up which defines a region of the CAM in which, according to the known hashing behavior, a match is guaranteed to be located—if such a match exists as a CAM entry. Each memory output is decoded and combined with the others to obtain an enable bus for banks of entries within the CAM. Larger CAM banks reduce complexity in the power saving circuits, but enable more matches than the minimum required. If more (including up to all) of the CAM is enabled than is necessary, then the CAM will still work normally, but useless entry matching will occur and CAM power savings will fall.

The match lines in a CAM array are typically pre-charged to the supply voltage VDD for each and every compare operation. Thus, for each mismatch condition, an associated match line ML is first charged toward VDD and then discharged toward ground potential. Current flow associated with this charging and discharging results in undesirable power consumption. Further, as the number of CAM cells in each row of a CAM array increases, capacitive loading on the match lines increases accordingly. As loading on the match lines increases, the current required to charge the match lines toward the supply voltage increases. Accordingly, as CAM words are widened, for example, to accommodate longer Internet addresses, power consumption resulting from charging the match lines during compare operations may significantly increase. Furthermore, because mis-matches are far more common than matches, as interne Addresses are lengthened and CAM words widened, power consumption increases substantially. Therefore, the need exists for a circuit architecture that reduces the power consumed by the CAM.

From one perspective, the invention can be seen as a CAM with additional power saving circuits. From another perspective, it is a hashing system which uses a CAM to find the match, if any, within each hash bucket. Those, and other advantages and benefits will become apparent from the Description of the Preferred Embodiments herein below.

BRIEF DESCRIPTION OF THE DRAWINGS

For the present invention to be easily understood and readily practiced, the present invention will now be described, for purposes of illustration and not limitation, in conjunction with the following figures, wherein.

DESCRIPTION OF THE PREFERRED EMBODIMENTS

Figure 1:
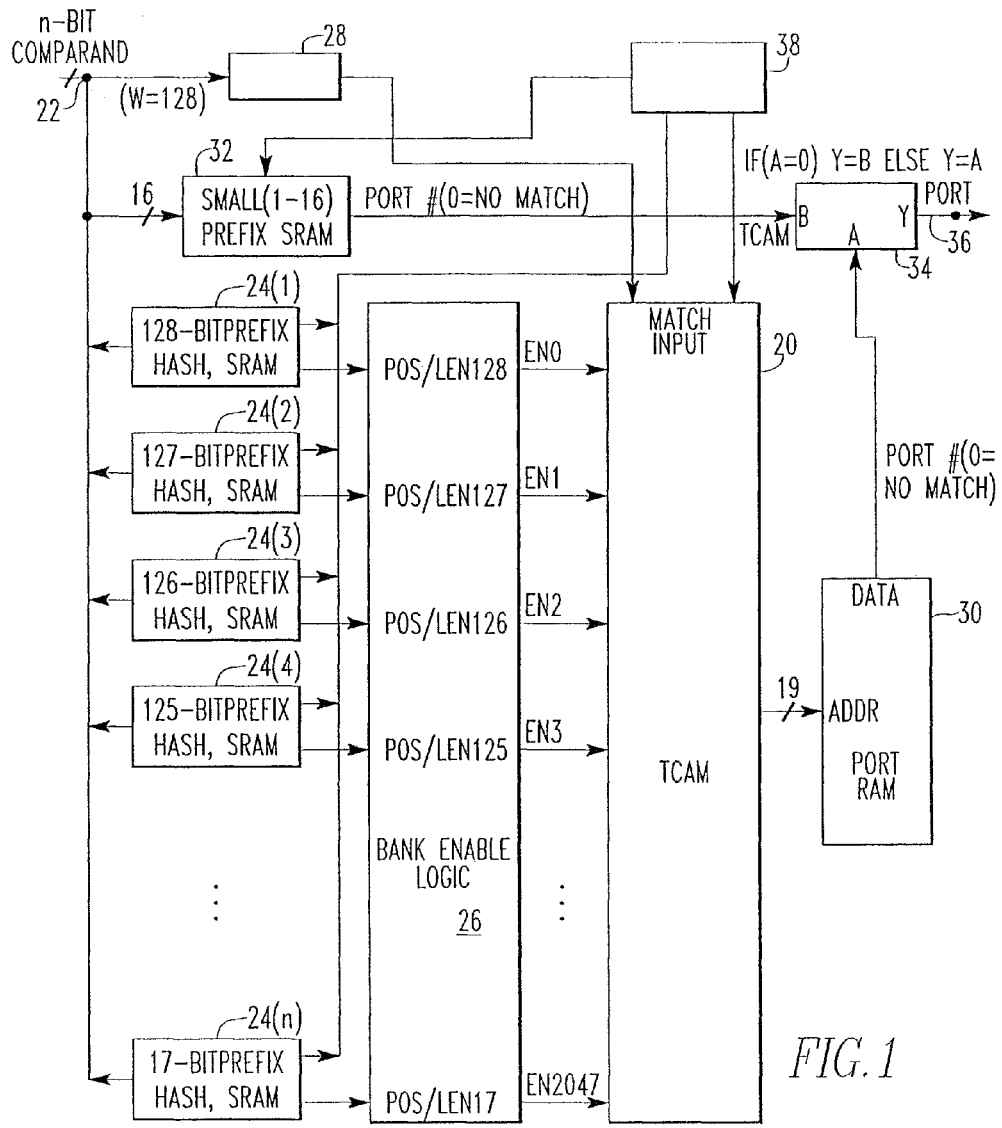
FIG. 1 illustrates a circuit architecture implementing the present invention.
Figure 6:
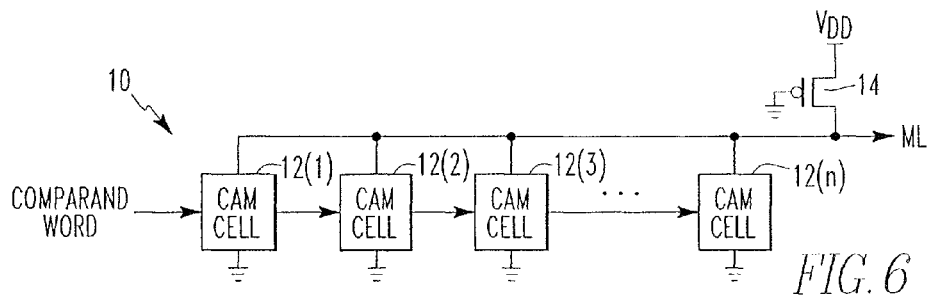
FIG. 6 illustrates a prior art CAM.

Referring to FIG. 1, FIG. 1 illustrates a circuit architecture implementing the present invention. The architecture illustrated in FIG. 1 is constructed around a TCAM. An n-bit comparand word is input to an input node 22. For example, if the circuit architecture of FIG. 1 is to be used to process address information in a routing device, the n-bit comparand word input at node 22 may be, for example, a 128-bit word. The comparand word is input, in parallel, to a plurality of hash/SRAM circuits 24(1)-24(n). Each of the hash/SRAM circuits 24(1)-24(n) produces information (as discussed more fully in conjunction with FIG. 2) which is input to bank enable logic 26. The bank enable logic 26 produces enable signals (as discussed more fully in conjunction with FIG. 3) which are input to TCAM 20 to enable, or precharge, portions of the TCAM 20. The TCAM 20 also receives the n-bit comparand word which may be input to the TCAM 20 through a delay circuit 28. The TCAM 20 compares the comparand word input through the delay circuit 28 to the enabled or precharged portions of the TCAM 20. If there is a match, the matched word is output to, for example, an output memory 30, which may be implemented by a RAM. The output memory 30 may be used to store information associated with each of the words stored in the TCAM 20. For example, output port information may be stored in output memory 30 so that an output port may be identified upon a match being found by TCAM 20.

As seen in FIG. 1, the routing of the n-bit comparand word is such that it is sent in parallel to each of the hash/SRAM circuits 24(1)-24(n), one circuit for each prefix length. However, for an internet-addressing scheme using 128-bit IPv6 addressing, small prefix lengths up to, for example 16, may be handled in an input memory device 32 which may be implemented by an SRAM. If prefixes 1 through 16 are handled by input memory device 32, then 128 minus 16 equals 112 prefixes to be processed by TCAM 20. Accordingly, one hundred and twelve hash/SRAM circuits 24(1)-24(112) are required. Each hash/SRAM circuit deals with a different prefix length, so the first hash/SRAM circuit 24(1) processes a prefix length of 17 bits, the next hash/SRAM circuit 24(2) processes a prefix length of 18 bits, and so on until the last hash/SRAM circuit 24(112) which processes the full 128 bits.

The architecture of FIG. 1 includes a switch 34 which is responsive to both the input memory 32 for small prefix lengths and the output memory 30 for port information. If a match (e.g. a non-zero port value) is output from memory 30, then the switch connects ports Y and A so that the output port information is available at an output port 36. Otherwise, port Y is connected to port B, and the port information from memory device 32 is available at output port 36.

Completing the description of FIG. 1, a processor 38 provides preprocessing capabilities for initializing the circuit architecture illustrated in FIG. 1. More particularly, and as further described herein below in conjunction with FIG. 4, the processor 38 allows the loading of SRAM 32, each of the SRAMs within the hash/SRAM circuits 24(1)-24(n), TCAM 20, and RAM 30.

Figure 2:
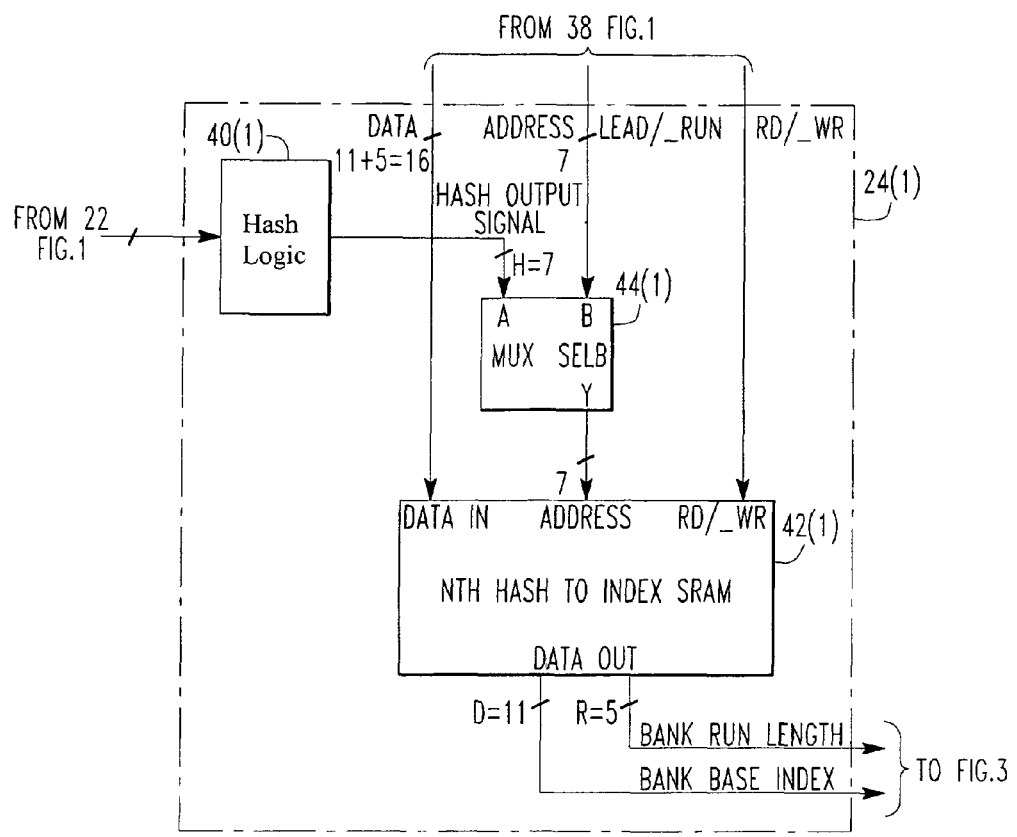
FIG. 2 illustrates one of the hash/SRAM circuits of FIG. 1.

Turning now to FIG. 2, FIG. 2 illustrates the details of the hash/SRAM circuit 24(1). It will be understood that the other hash/SRAM circuits 24(2)-24(n) illustrated in FIG. 2 are of similar construction and operation. However, each of the hash/SRAM circuits 25(1)-25(n) is responsive to a different portion of the n-bit comparand word, so the hashing network logic 40(1)-40(n) is different in each.

In FIG. 2, according to a presently preferred embodiment, the hash/SRAM circuit 24(1) is comprised of hash logic 40(1). The hash logic 40(1) may be implemented using simple exclusive OR logic networks to generate each hash output bit from a randomly pre-determined set of hash inputs. Additionally, it is preferred that all of the input bits to each hash function contribute in some way to the overall output hash values. Those of ordinary skill in the art will recognize that there are many ways other than exclusive OR logic networks to implement the hash logic 40(1). This invention is not limited to any particular way of implementing hash logic 40(1).

Hash logic 40(1) produces a hash output signal (shown as 7 bits) which is used to identify a portion or portions of the TCAM 20. The identified portions are then precharged, or are identified as a result of being precharged. The manner in which the hash output signal is used to identify, enable and/or precharge portions of the TCAM 20 is not an important future of the present invention. Accordingly, although the presently preferred method of using the hash output signal to identify, enable, and/or precharge portions of TCAM 20 will now be described, the present invention is not to be limited by the presently preferred embodiment.

A hash-to-index SRAM 42(1) is responsive to the hash output signal. In the embodiment shown in FIG. 2, the hash output signal is input to a multiplexer 44(1) which also receives address information from the processor 38. The processor 38 also controls whether the hash-to-index SRAM 42(1) is in the read or write mode and, in a preprocessing or initialization mode, provides data to load all the hash-to-index SRAMs 42(1)-42(n). In the operational mode, the mux 44(1) inputs the hash output signal to the address port of the hash-to-index SRAM 42(1). In response to a match in the SRAM 42(1); two pieces of information are output. The first piece of information is a bank base index, which is position or start address information, while the second piece of information is a bank run length that identifies how many positions or addresses should be selected. Those two pieces of information are input to a bank decoder 50(1) illustrated in FIG. 3.

Figure 3:
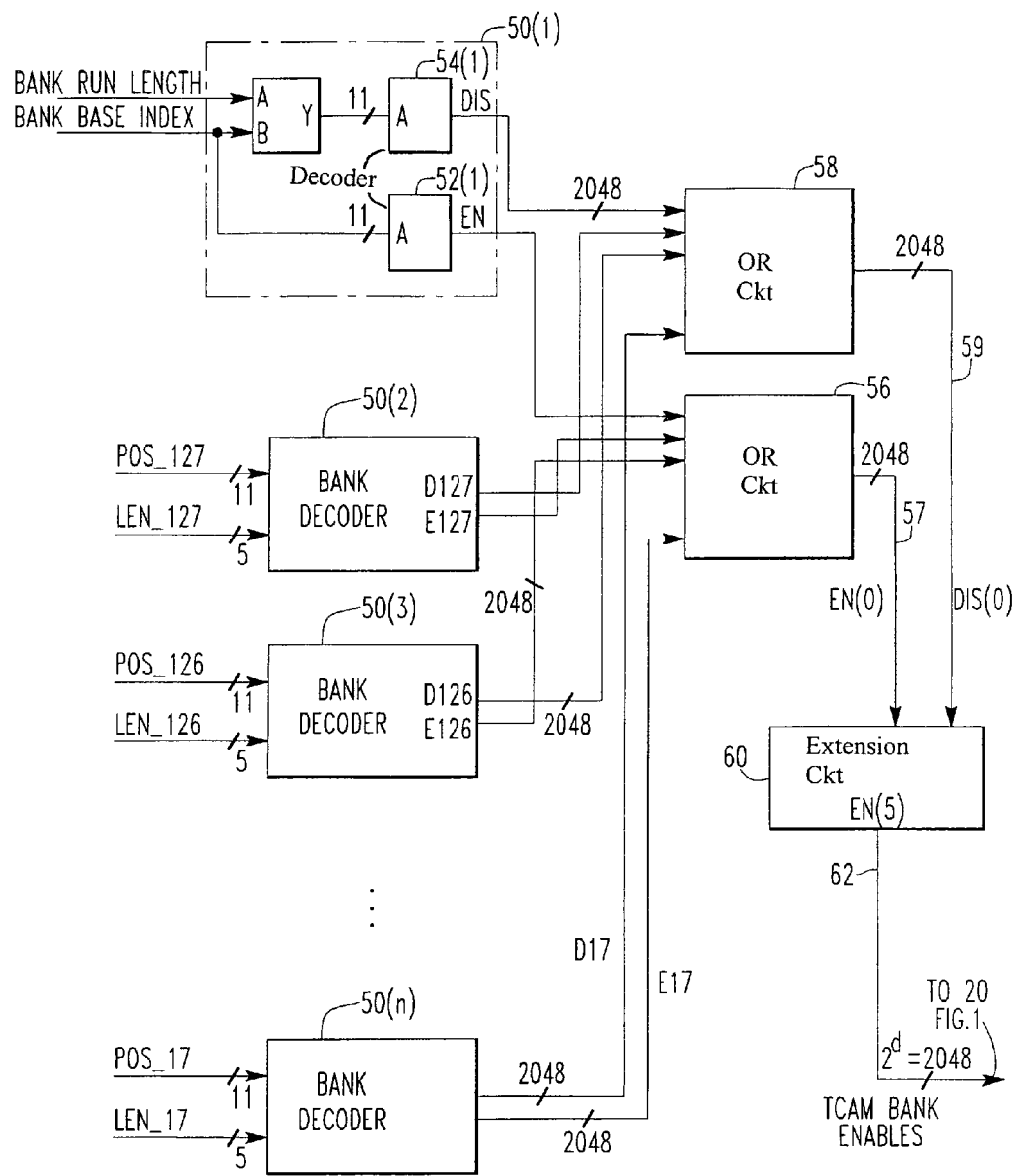
FIG. 3 illustrates a portion of the bank enable logic of FIG. 1.

Turning now to FIG. 3, the bank base index and the bank run length are input to a bank decoder circuit 50(1). In the presently preferred embodiment, the number of bank decoder circuits 50(1)-50(n) is equal to the number of hash/SRAM circuits 24(1)-24(n). Each of the bank decoder circuits 50(2)-50(n) is identical in construction and operation to bank decoder circuit 50(1) which is shown in detail in FIG. 3. The bank base index, which identifies the starting position or starting address, is input to an 11-bit to $2^{11}$ decoder 52(1). The decoder 52(1) produces a 2,048 bit enable signal.

The bank base index and the bank run length are input to an adder 53(1) which adds the run length to the bank base index to identify the end position or end address of each bank enable region. That position or address is then input to a decoder 54(1), which is similar to decoder 52(1), which produces a 2,048 bit wide disable signal.

Each of the other bank decoder circuits 50(2)-50(n) are similarly responsive to different bank base indices and bank run lengths so that each produces a 2,048 bit wide enable signal and a 2,048 bit wide disable signal.

As an alternative, each of the hash-to-index SRAMs 42(1)-42(n) may provide both a bank base index and a bank end index. Under those circumstances, adders 53(1)-43(n) in FIG. 3 may be eliminated, and the bank end index would be input directly to decoders 54(1)-54(n). Other alternative embodiments include moving the hash-to-index SRAMs 42(1)-42(n) from hash/SRAM circuits 24(1)-24(n), respectively, and including the hash-to-index SRAMs 42(1)-42(n) in bank decoder circuits 50(1)-50(n), respectively. As previously stated, the particular manner in which the hash output signals are used to ultimately enable, identify and/or precharge portions of the TCAM 20 is not an important feature of the present invention. The circuitry between the hash logic circuits 40(1)-40(n) and TCAM 20 may be implemented in a variety of ways, the presently described embodiment being the presently preferred embodiment.

Returning now to FIG. 3, the enable outputs from all of the decoders 52(1)-52(n) are combined in circuit 56. The combination may be, for example, by ORing together all of the enable signals from the decoders 52(1)-52(n) to obtain a 2,048 bit bank enable bus 57. With 112 prefix lengths, up to 112 bits can be enabled at a time within that bus. Fewer bits may occur if information for more than one prefix start index lies within the same TCAM bank. The stop positions are similarly ORed in circuit 58 to obtain up to 112 disable bits in a 2,048 bit bank disable bus 59.

Both the bank enable bus and 57 and the bank disable bus 59 are input to a circuit 60 which extends (replicates as described below) all of the enable bits upward until each extension reaches its end or stop address. The resulting output bus 62 from circuit 60 now has a "1" beginning at each original start position and continuing up to and including the next stop position. The bus 62 is a 2,048 bit bus that is input to the TCAM 20 for precharging the addresses between the start and end addresses identified by the hash-to-index SRAMs 42(1)-42(n) of FIG. 2.

The following code fragment shows a method of extending bits using the C language. The code shows a series of logical relationships from the 2,048-bit wide enable bus 57 and disable bus 59 for values En[0], Dis[0], through a first logic processing level to values for En[1], and Dis[1], and so on through a total of r=5 (found statistically below) at fixed hardware processing levels to obtain En[5] and Dis[5]. The bus En[5] is used to drive the 2,048 TCAM bank enables, so some logic to generate Dis[5] can be removed or optimized away during circuit synthesis. The number of processing levels is ideally equal to the number of bits selected to represent bank index ranges, e.g. 5 in the example above. The looping and indexing shows the relationships between wires and the logic that connect them—a form of circuit building instruction. The actual "1" extension circuit therefore has no loops and indexing as all wires and logic are pre-connected according to the wire index and logic relationships.

---

Code Example 1: C code showing how to build 1's expansion logic.
/*Each '1' in En[0] expands to 25 = 32 '1's on En[5], unless expansion is blocked by '1's on Dis[0] */
/*declare 6 (5 + 1) levels of En and Dis buses as arrays of wires */
wire En[6] [2048], Dis [6] [2048];
/*En[0] and Dis[0] are first set here as inputs from the decoders. */
/*r=5 bus build-levels after input bus. Index i selects busses */
/* each bus has width from decoder output = 2048 wires (=2d, d = 11) */
for (i = 1; i <=5; ++i)
{
    /*for each wire in the selected En and Dis busses */
    for (j = 0; j << 2048; ++j)
    {  /*show logic relations between busses at each level */
      /*i, j, k index values only control the circuit building process */
      k = j - (1 << (i-1));
      if (k < 0) /* build different things depending on index k */
      { /*join wire to bus level i from previous level i-1 */
        Dis [i] [j] = Dis[i-1] [j];
        En[i] [j] = En[i-1] [j];
      }
      else
      {/*build logic to assign to bus level i from previous level i-1 */
        Dis[i] [j] = Dis[i-1] [j] |(Dis[i-1] [k] & ~En[i-1] [j]);
        En[i] [j] = En [i-1] [j] | (En[i-1] [k] & ~Dis [i-1] [j]);
      }
    }
}
/*En[5] now forms the 2048-bit bank-enable output to the TCAM */

---

For a TCAM 20 with a large number of entries, specifying the exact position and size of a matching region requires much more logic circuits than for less precise calculations. To reduce complexity in the power-saving logic, the TCAM is evenly divided into banks for match-enabling control purposes only. In the example of FIG. 1, a 524,288 (n=19 bit address) entry, TCAM 20 is divided into 2,048 banks, so each bank has 524,288/2048=256 entries. Each bank shares a single match enable input. In that way, the bank selection logic can be dramatically reduced in size, while still allowing significant power savings during TCAM matches.

In a typical TCAM architecture, few matches occur on routing an input to a TCAM, so most TCAM entries are mis-matched, and the corresponding match lines are discharged from the pre-charged value. On the next access, all of the match lines are precharged again. That simultaneous activity on multiple match lines results in high-power dissipation in the TCAM. To avoid that power dissipation, the present invention limits the number of rows which are precharged to only those banks in which a match is possible. By not precharging rows on which a match is not possible, power saving is achieved. Most of the circuits illustrated in FIG. 1 to support the TCAM consume very little power within and after the index decoding stages (detailed in FIG. 3) as most signals are inactive most of the time. The hash-to-index SRAMs 42(1)-42(n) of FIG. 2 are where most of the power consumption of the power-saving architecture illustrated in FIG. 1 occurs.

If the number of TCAM entries, E, is substantially greater than prefixes $*2^h$, then the average fraction of enables active on each TCAM access is upper bounded and closely approximated by:

$$\text{Fraction} \leq \frac{\text{Prefixes} \times (2^b - 1) + \frac{E}{2^h}}{2^m} \quad (1)$$

Where b=log 2 (number of entries in each TCAM bank); and
h=number of bits on hash circuit output (see FIG. 2); and
m=address wires to write CAM entries.

Equation (1) relates to power saving only in the TCAM 20 in FIG. 1. For an even distribution of 112 long prefixes (i.e. excluding the 16 prefixes handled by the small prefix SRAM 32) from 17 to 128 bits, a full ($E=2^m$) TCAM, and with hardware configurations of
b=8
h=7 and
m=19
then equation (1) gives the fraction of the TCAM enabled as 0.06228. That represents about 1/16 of the TCAM entries used for each access. That is a worst-case figure for any prefix length distribution and a typical interaction of the hash functions with the routing tables. From the equation, it can be seen that:
1. reducing the number of prefixes,
2. reducing the bank size,
3. reducing the number of entries programmed into the TCAM,
4. increasing the number of hash bits, and
5. increasing the TCAM size
all help reduce the fractional power consumption further. However items 2 and 4 incur additional hardware costs in the hash-TCAM power saving circuits. Note that if the number of prefixes is sufficiently large, then the bank sizes must be reduced to save any power. Maximum values for the number of prefixes and entries handled are determined at circuit build time. Items 1 and 3 depend upon the contents of IP routing tables loaded prior to circuit operation.

Figure 4:
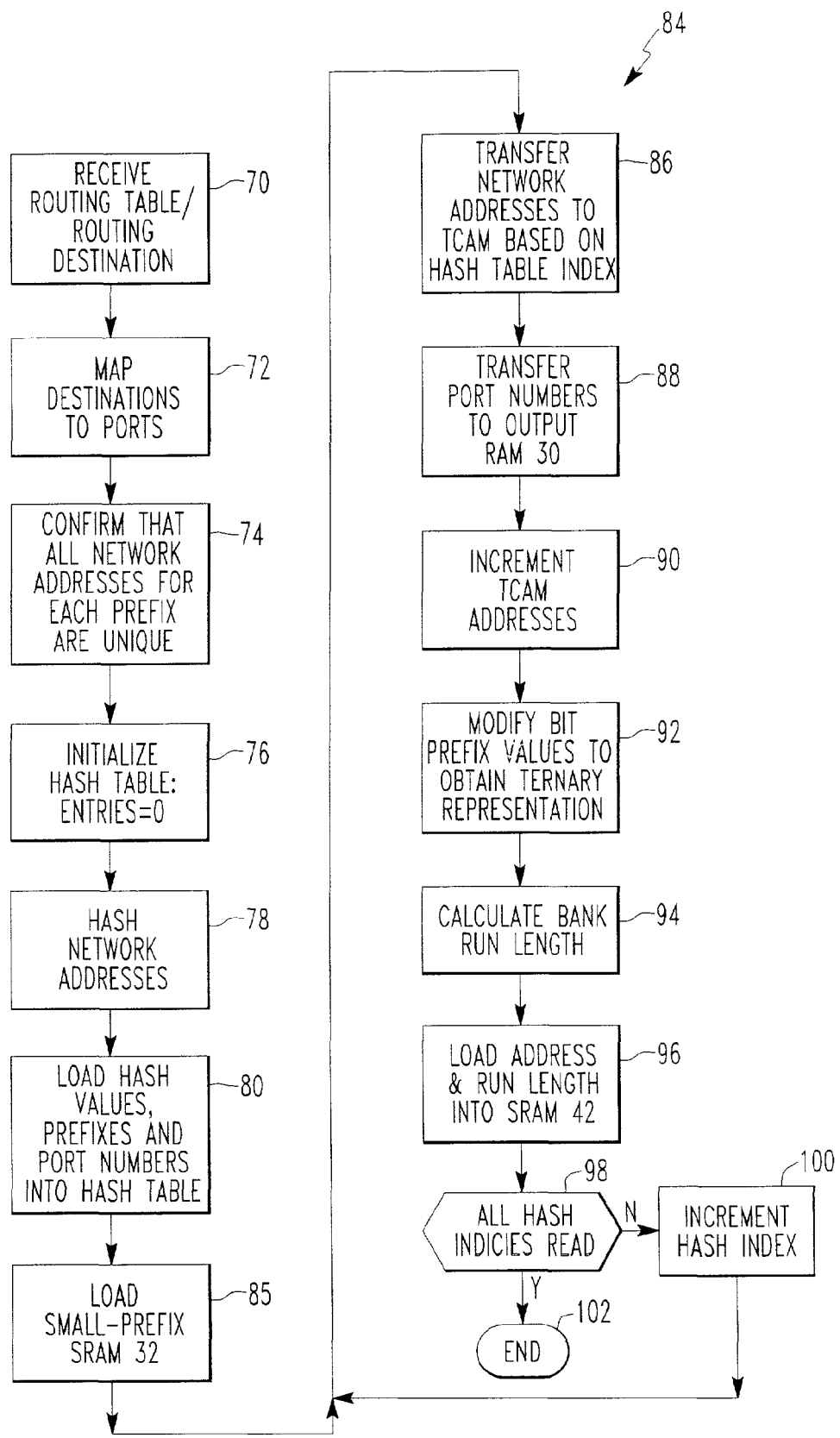
FIG. 4 is a flow chart illustrating the pre-processing mode of the processor of FIG. 1 which initializes the hardware shown in FIG. 1.

FIG. 4 illustrates an algorithm performed by processor 38 (FIG. 1) during a preprocessing mode which initializes the hardware shown in FIG. 1. The processor 38 receives at step 70 a routing table, which is a set of IP address values, and a limited number of routing destinations. Routing destinations usually represent the IP addresses of known neighbors on the network. At step 72, each unique routing destination is mapped onto its own short port number.

At step 74, the algorithm obtains the associated prefix lengths from the routing tables. The algorithm may check that all the network addresses for a given prefix length are different. The next step, step 76, is to create and initialize a two-dimensional hash table in software memory. The hash table elements are actually references to linked lists. Linked lists are lists in which each member of a list contains a reference to the next member in the list. Linked lists have the advantage that list insertion (preferably into the start of the list) can be very fast, as only the links or references have to be changed, and no data has to be "bubbled up" to make room for new entries. The table entries are set to a null reference to show that no linked lists are attached yet.

At step 78, each network address is hashed in software, using the prefix value to select the same prefix bit mask and hash function as used for that prefix length in the hardware. The resulting hash output value and prefix length are then used as the minor index and major index, respectively, into the hash-table at step 80. Each table element points to the start of a linked list of values that represent all the prefixes with the same prefix length and the same hash value. The port numbers associated with the prefix values along with the prefix values and prefix length are then inserted in to the selected linked list. All network addresses are thereby sorted and inserted into appropriate linked lists in the software hash table.

The next series of steps 84 programs the hardware of FIG. 1, i.e., the hash-to-index SRAMs 42(1)-42(n) (FIG. 2), the small prefix SRAM 32, TCAM 20, and the output RAM 30. The processor 38 first loads the small prefix SRAM 32 at step 85 preferably using the sorted information available from the software hash table. The processor 38 then systematically works through each prefix longer than the small prefix SRAM 32 can handle. For each prefix length, the processor 38 proceeds to work systematically through each possible hash index from hash logic 40(1), as follows.

At step 86, for each hash table index, the processor 38 reads the corresponding software hash table value as a reference to the start of a linked list. The processor 38 then goes down the linked list, transferring network addresses sequentially into the current TCAM address, and at step 88, port numbers into the corresponding output RAM 30 address. The processor 38 then increments the TCAM address at step 90. The bit representation of IP addresses are modified at step 92 with the prefix values to obtain the ternary {0,1,X} representations used for matching in the TCAM. The processor 38 then calculates at step 94 the inclusive first and exclusive last TCAM bank indices where the linked list has been written, and loads them at step 96 as bank start and stop indices, or alternatively as bank start indices and bank run-lengths, into the hash-to-index SRAMs 42(1)-42(n) for the current prefix. The index/run-length information comprises the hash-to-index SRAMs 42(1)-42(n) data, and the output of the current hash function forms the SRAM address. Calculating bank indices from TCAM addresses is simplified by choosing TCAM bank lengths to represent powers of 2 in the TCAM address ranges. At step 98 a decision is made whether all the hash indices have been read. If not, the hash index is incremented and the process returns to step 86. Otherwise, the process ends at step 102.

As noted, the small-prefix SRAM 32 can be separately loaded to handle all the shorter prefixes. In a preferred embodiment, the software hash table used to load the TCAM is previously generated for all legal prefix lengths, and the short (16 or less in FIG. 1) prefix entries in the software hash table is then used to expedite loading of SRAM 32. Loading the small prefix SRAM 32 is known in the art.

With well designed hash functions, a given set of preferences should result in a roughly equal number of hash collisions in each hash bucket. This is true for random prefix distributions, as well as systematic address distributions, such as sequences of values in some undetermined range of bits. If the distribution of address prefixes in routing tables is not known, a flat distribution can be assumed, so the number of hash output bits for each prefix length should be the same.

When the processor 38 packs data into the TCAM 20, the last of a set of TCAM entries associated with one hash value may lie in the same TCAM bank as the start of a set for the next hash value. That does not cause problems, as only those entries with the correct network address value will match in the TCAM in any case.

To enable fast modification, the processor can write one or more "holes" into the TCAM 20 as long as accommodations are made when programming the hash-to-index SRAMs 42(1)-42(n). Holes can use an illegal (e.g. all-zero) network address to represent a prefix that can never be matched at the TCAM input. If routing tables are updated, then the processor 38 can insert a new entry into the TCAM by over-writing a hole, and updating the hash-to-index SRAMs 42(1)-42(n) ranges for the prefix length if the bank index range increases. Entries can be easily deleted by writing a hole value over them. In all cases, the software hash tables used to load the TCAM can also be updated as routing tables change. The software hash tables can also be used to help efficiently update the TCAM and hash-to-index SRAMs 42(1)-42(n) when needed.

For each possible prefix length, a hash function has previously been designated to work with it. Each hash function output is a function of all the bits within its prefix length. Each bit of hash circuit output is a different function of the input bits that are the other bits in the function. The purpose of hashing in this case is to distribute any systematic or random set of input addresses reasonably evenly between its output bucket values, and to reduce the number of bits at the hash output compared to the hash input. This behavior is only guaranteed if knowledge of the hash functions is not used to generate the address set.

The following circuit parameters are defined:
m=address wires to write CAM entries
h=number of bits on hash circuit output (see FIG. 2)
H=2h
b=Log 2 (number of entries in each TCAM bank)
d=m−b=number of decoder bits for bank selection (see FIG. 3)
r=number of bits representing the maximum anticipated number of banks with same network address hash value from a routing table (see FIG. 2 for bank run-length output, and the number of stages in 1's expansion above)
w=IP address length in bits (number of prefixes cannot be greater than w)
E=number of entries in the TCAM (cannot be greater than $2^m$)

The probability that a given number of exactly n TCAM entries is associated with one hash value (in H possible hash values) can be obtained from the binomial theorem:

$$p[E, n, H] = \frac{E!}{(E-n)!n!}\left(\frac{1}{H}\right)^n\left(1 - \frac{1}{H}\right)^{E-n} \quad (2)$$

Equation 2 gives the probability of n values in E entries in the TCAM being associated with the same hash value when H hash values are used. For each hash value, a maximum number of N of TCAM entries is defined in which it is known that the matching prefix will be found, so n must lie in the range from 0 to N inclusive.

If an inclusive range of n from 0 to N is allowed for in hardware, then the probability of exceeding N is given by:

$$p(\text{exceed}) = 1 - \left(\sum_{n=0}^{N} p[E, n, H]\right)^L \quad (3)$$

L is the number of software linked lists used to load the TCAM. The next step is to determine an upper value for r which is related directly to the maximum expected number of routing table sub-net addresses with the same prefix lengths that hash to the same value. In this case, fewer prefixes and the more entries gives the longest linked-lists and worst case fit. For one prefix, the expected number of bits required to encode the number of banks used per linked list is given by:

$$r = m - b - h \quad (4)$$

For the circuit of FIG. 1, m=19, b=8, h=7, which gives r=4, or a maximum of $2^r-1=15$ banks to hold each linked list. This average size is insufficient when the TCAM is full (E=$2^m$), so r is increased to 5 and analyzed. The maximum number of entries per linked-list supported in this case is N=$(2^r-1)2^b$=7, 936. If the TCAM is full, then the chance that N or more entries are needed for a random hash distribution is:

$$p(\text{exceed}) < 10^{-618} \quad (5)$$

which is an astronomically low probability as long as hashing behaves in the expected manner. Two or more prefixes reduce the probability of no fit even further.

The circuits shown are exemplary only, and are not intended to limit the scope of the invention. A simpler version of the IPv6 case can be designed for IPv4, with prefix lengths 17 to 32 handled by a TCAM. The design is much smaller in that case. A different number of bits (not just 16) can be handled by the small prefix SRAM 32. The circuits in the figures can be pipelined in hardware to provide high throughput rates. In applications where handling variable length prefixes and longest prefix matching is not a requirement, the circuit of FIG. 1 can be simplified to deal with a single prefix, using just one hash circuit, one hash-to-index SRAM, etc. A conventional CAM may also be used instead of a TCAM in this case. Also, portions of or the entire circuit of FIG. 1 may be implemented in software. When the entire circuit is implemented in software, a search algorithm uses the previously described set of hash functions, the two-dimensional hash table, and the linked lists. Obtaining a port value from an IP address requires finding a match by searching over each possible prefix length. For each length, the corresponding masking and hash functions are applied and the hash output and prefix length form the minor and major indices, respectively, into the same hash table as was used in the pre-processing stage. The value from the hash table is a reference to the start of a linked list. The search for a match can then progress down the selected linked list, comparing the top prefix-length bits of the IP address input with the stored IP addresses from the routing table. If an exact match is found in the prefix bits, then the associated port value is returned. The port value associated with the longest prefix match is selected as the final result. This algorithm is fairly slow on a processor, although it can be sped up by working from the longest prefix downwards, and finishing immediately when a match is found.

The above software algorithm can be implemented to run very fast in the hardware shown in FIG. 1, as i) all the hash functions (one per prefix length) can be performed in parallel using dedicated hash circuits, and ii) traversal of each linked list can be performed in parallel because the linked list data for matching is placed in the TCAM where all compares occur in parallel. In the software algorithm, the same address value is compared with each linked list entry, so the hardware search equivalent is achieved by placing all the linked lists in the TCAM, and enabling matching on those regions of the TCAM that hold the linked lists that would have been selected in the software solution.

As discussed above in conjunction with FIG. 4, the hardware solution requires that the TCAM is loaded with the linked-list routing information before routing can occur. The linked list matching addresses are sequentially packed into the TCAM in order of prefix length (major index) and hash value (minor index). The format of the IP address and prefix length from each routing table entry is modified at some stage to represent the {0,1,X} format per bit used by the TCAM. The associated port number is not stored in the TCAM. Instead, the TCAM output is a priority encoded match address that is then used as an index into a RAM that contains the associated port values. The order of data transferred from within a linked list into the TCAM does not mater, as long as they are not stored interspersed with data from other linked lists. The match enables of contiguous TCAM entries can be grouped into blocks, simplifying the block-enable circuits, while enabling more TCAM entries for matching than the true minimum. The resulting increase of power dissipated in the power saving circuit may be more than offset by the decrease in the dissipated power due to disabling blocks in the TCAM.

Figure 5:
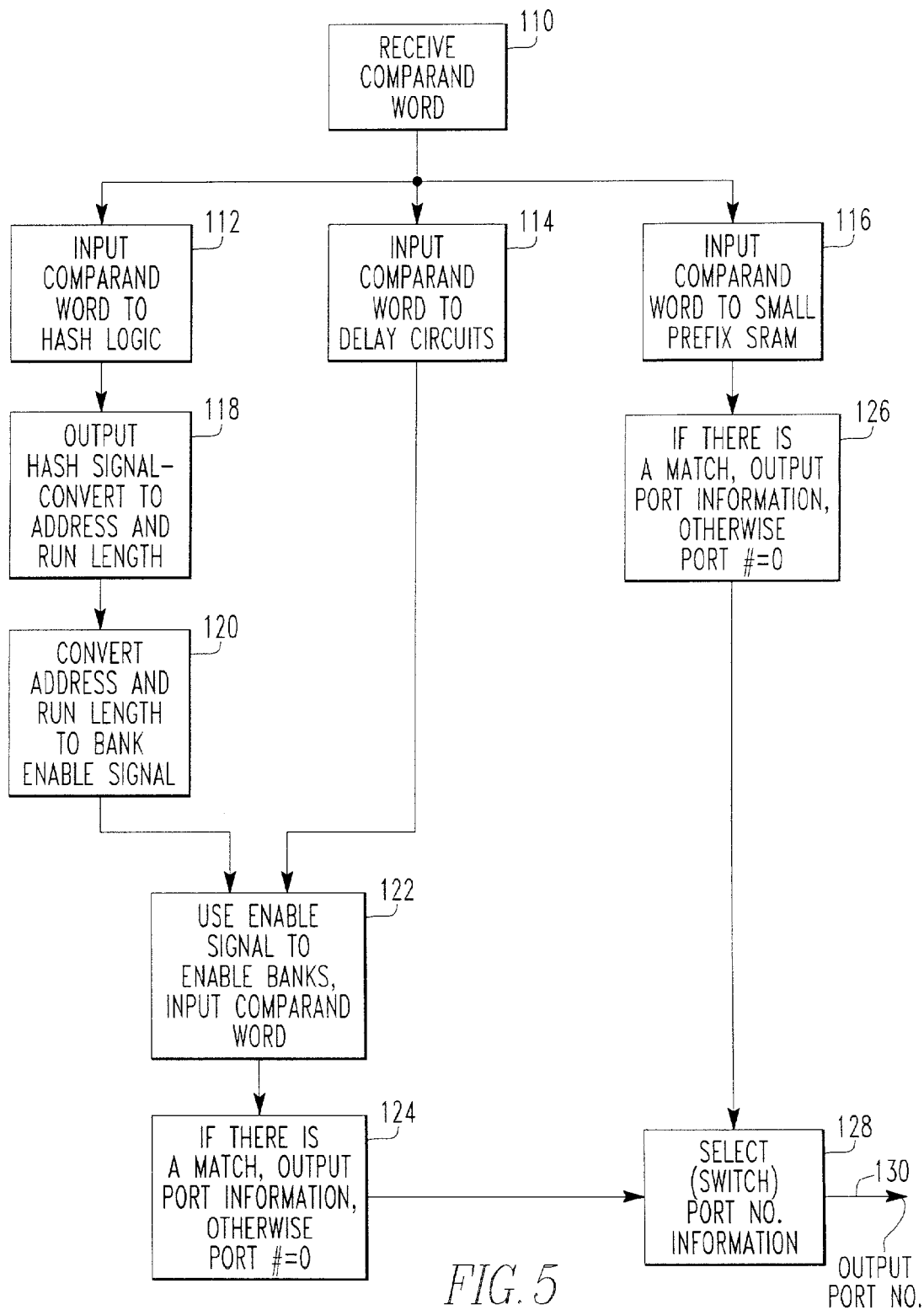
FIG. 5 is a flow chart illustrating the operational mode of the hardware shown in FIG. 1.

FIG. 5 is a flow chart illustrating the operational mode of the hardware illustrated in FIG. 1. After the comparand word is received at block 110, the comparand word is input in parallel to the hash logic 40(1)-40(n), to the delay circuit 28 and to the small prefix SRAM 32 as illustrated by blocks 112, 114 and 116, respectively. The output of the hash logic 40(1)-40(n) is input to the SRAMs 42(1)-42(n), respectively which produce the bank base index signal and bank run length signal as shown by block 118. Those signals are converted by the bank enable logic 26 into a bank enable signal as shown by block 120. At block 122, the bank enable signals are used to enable the banks of the TCAM 20 while the input comparand word is also input to the TCAM 20. Those of ordinary skill in the art will recognize that the pipeline timing of the enabling of the TCAM banks vis-à-vis the timing of the input of the comparand word to the TCAM 20 must match for correct operation within the TCAM 20. If there is a match in TCAM 20, the information is output to the output RAM 30 which then outputs port information. If there is no match, then the port number is set to zero as shown in block 124. Substantially simultaneously, a match is being performed using information in the small prefix SRAM 32. If port information is available as a result of a match, that information is output; otherwise, the port number equals zero as shown in block 126. Block 128 represents the switch 34 or a selection function. If there is a match from block 124, then the output of block 124 is selected to be output at node 130, otherwise the output of block 126 is selected to go to node 130.

One advantage of the present invention is the use of hashing to reduce power consumption in the TCAM 20. By taking the comparand word, hashing it (in either hardware or software) using a pre-defined hash function, and using the hash function output to control (via a pre-programmed look-up hash-to-entry table) the region of the CAM enabled for matching, power is saved. Disabled entries use less power by reducing signal activity where possible. For the power reduction system to allow the CAM to function correctly, the entries programmed into the CAM with the same hash function on their value must be grouped into contiguous CAM addresses. The enables for pre-defined groups of CAM entries are wired together to produce enabled banks. Preferably, the banks each combine a uniform, pre-determined power of 2 number of CAM entry enables. The special case (when $2^0=1$ entries per bank) is used when each CAM entry is separately controlled. Otherwise, the hash-to-entry look-up table becomes a hash-to-bank index look-up table implemented with SRAM. Fewer bits are then needed to represent the enables and therefore the decoder to drive the bank enables is simplified. Adjacent hash groupings that lie within the same bank are allowed.

Another advantage is that "holes" can be programmed between valid CAM entries as long as the look-up table is programmed to correctly span the proper enables required for each hash value. Holes can be inserted during loading to allow for later insertion of CAM entries during updates. Holes can also be created later when items are deleted. A hole is most easily formed at a CAM entry by sorting a value in it which never occurs as a CAM input.

Another advantage of the present invention is that multiple prefix lengths for IP packet routing can be accommodated. For each prefix length, a hash function takes the prefix bits and hashes them to fewer bits to provide an input to a corresponding look-up take. The outputs of all the look-up tables are combined to provide bank enables. The data to be programmed into the CAM is now pre-sorted by the CAM loading processor according to prefix length as the major sort index, and the hash value within each prefix becomes the minor sort index. The CAM uses the programming address of its entries to also prioritize any multiple matches so that the longest prefix match is chosen. A ternary CAM is used instead of a regular CAM so that host address parts of IP addresses can be ignored for matching purposes.

While the present invention has been described in conjunction with preferred embodiments thereof, those of ordinary skill in the art will recognize that modifications and variations in addition to those already discussed are possible. The present invention is intended to include such modifications and variations and is intended to be limited only by the following claims.

What is claimed is:

1. A method, comprising:
inputting an input word to a plurality of hash circuits, each hash circuit being responsive to a different portion of said input word;
outputting a hash signal from each hash circuit;
enabling portions of a CAM in response to said hash signals;
inputting said input word to said CAM wherein the inputting of said input word to said CAM is delayed until said enabling is completed;
comparing said input word in the enabled portions of said CAM; and
outputting information responsive to said comparing.

2. The method of claim 1 additionally comprising assigning a mask to each hash circuit such that each hash circuit is responsive to a different n-bit portion of said input word.

3. The method of claim 1 additionally comprising inputting the least significant n bits of said input word to a memory, and wherein said outputting includes selecting between information responsive to a match being found in said memory and information responsive to a match being found in said CAM.

4. The method of claim 1 wherein said enabling includes using said hash signals to select from a plurality of stored signals, and using the selected stored signals to enable a portion of said CAM.

5. The method of claim 4 wherein said using the selected stored signals includes using a starting index and a run length.

6. The method of claim 4 wherein said using the selected stored signals includes using a starting index and an ending index.

7. A method of operating a CAM, comprising:
hashing a comparand word;
precharging certain portions of a CAM in response to said hashing, wherein said precharging includes using hash signals to select from a plurality of stored signals, and using selected stored signals to precharge portions of said CAM, using the selected stored signals including using a starting index and a run length; and
inputting said comparand word to said CAM.

8. The method of claim 7 wherein said hashing includes hashing different n-bit portions of said comparand word.

9. The method of claim 7 additionally comprising inputting the least significant n bits of said comparand word to a memory, and outputting information responsive to one of a match being found in said memory and a match being found in said CAM.

10. The method of claim 7 additionally comprising delaying the inputting of said comparand word to said CAM until said precharging is completed.

11. The method of claim 7 wherein said using the selected stored signals includes using an ending index.

12. A method of operating a CAM for processing address information, comprising:
inputting an Internet address to a plurality of hash circuits, each hash circuit being responsive to a different portion of said address;
outputting a hash signal from each hash circuit;
using said hash signals to identify portions of a CAM, wherein using said hash signals includes using said hash signals to select from a plurality of stored signals, and using the selected stored signals to precharge portions of said CAM, wherein using the selected stored signals includes using a starting index and an ending index;
inputting said address to said CAM;
comparing said address in only the identified portions of said CAM; and outputting port information in response to a match being found in said CAM.

13. The method of claim 12 additionally comprising assigning a mask to each hash circuit such that each hash circuit is responsive to a different n-bit portion of said address.

14. The method of claim 12 additionally comprising inputting the least significant n bits of said address to a memory, and wherein said outputting includes selecting between port information associated with a match in said memory and port information associated with a match in said CAM.

15. The method of claim 12 additionally comprising delaying the inputting of said address to said CAM until portions of said CAM have been precharged in response to said hash signals.

16. The method of claim 12 wherein said using the selected stored signals includes using a run length.

17. A method of operating a CAM for processing address information, comprising:
hashing different prefixes within an Internet address;
precharging certain portions of a CAM in response to said hashing;
comparing said Internet address in said precharged portions of the CAM, wherein the comparing is delayed until said precharging is complete; and
outputting information in response to a match being found in the CAM.

18. The method of claim 17 additionally comprising inputting the least significant n bits of said address to a memory, and wherein said outputting information includes selecting between information associated with a match in said memory and information associated with a match in said CAM.

19. The method of claim 17 wherein said precharging includes using said hash signals to select from a plurality of stored signals, and using the selected stored signals to precharge portions of the CAM.

20. The method of claim 19 wherein said using the selected stored signals includes using a starting index and a run length.

21. The method of claim 19 wherein said using the selected stored signals includes using a starting index and an ending index.

22. A circuit, comprising:
a CAM;
a plurality of hash circuits each for producing a hash signal in response to a portion of a comparand word;
a plurality of memory devices responsive to said hash circuits;
enable logic, responsive to said plurality of memory devices, for enabling portions of said CAM; and
a delay circuit for inputting the comparand word to said CAM.

23. The circuit of claim 22 wherein said plurality of memory devices includes a plurality of SRAMs.

24. The circuit of claim 22 additionally comprising an output memory device responsive to said CAM for outputting information in response to a match in said CAM.

25. The circuit of claim 24 additionally comprising an input memory device responsive to a portion of the comparand word, and a switch responsive to said input memory device and said output memory device.

26. The circuit of claim 22 additionally comprising a processor for initializing said hash circuits, said plurality of memory devices and said CAM.

27. A method of initializing hardware having a CAM divided into a plurality of banks, said method comprising:
transferring network addresses to the CAM based on an index to a hash table;
transferring port numbers to an output memory device responsive to the CAM;
modifying bit prefix values to obtain a ternary representation;
calculating bank run length information; and
loading bank starting address and bank run length information into a plurality of memory devices.

28. The method of claim 27 additionally comprising periodically transferring invalid network addresses to the CAM.

29. The method of claim 27 additionally comprising transferring port information to an SRAM for prefixes below a certain length.

30. The method of claim 27 wherein said bank run length information includes one of a bank end address and a bank address span.

* * * * *

UNITED STATES PATENT AND TRADEMARK OFFICE
CERTIFICATE OF CORRECTION

| | | |
|---|---|---|
| PATENT NO. | : 8,112,578 B2 | Page 1 of 1 |
| APPLICATION NO. | : 10/002461 | |
| DATED | : February 7, 2012 | |
| INVENTOR(S) | : Keith R. Slavin | |

It is certified that error appears in the above-identified patent and that said Letters Patent is hereby corrected as shown below:

In column 12, lines 56-57, in Claim 1, delete "inputting," and insert -- inputting --, therefor.

Signed and Sealed this
Tenth Day of April, 2012

David J. Kappos
*Director of the United States Patent and Trademark Office*